(12) United States Patent
Maurio et al.

(10) Patent No.: US 9,835,695 B2
(45) Date of Patent: Dec. 5, 2017

(54) LINEAR POSITIONING SYSTEM UTILIZING HELICALLY POLARIZED MAGNET

(71) Applicants: Joseph Michael Maurio, Westminster, MD (US); Charles C. McCarthy, Timonium, MD (US); Mark Mulhern, Timonium, MD (US)

(72) Inventors: Joseph Michael Maurio, Westminster, MD (US); Charles C. McCarthy, Timonium, MD (US); Mark Mulhern, Timonium, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/473,160

(22) Filed: Mar. 29, 2017

(65) Prior Publication Data
US 2017/0299665 A1 Oct. 19, 2017

Related U.S. Application Data

(63) Continuation of application No. 14/195,530, filed on Mar. 3, 2014.

(51) Int. Cl.
*G01V 3/00* (2006.01)
*G01R 33/04* (2006.01)
(Continued)

(52) U.S. Cl.
CPC ............ *G01R 33/04* (2013.01); *G01D 5/145* (2013.01); *G01R 33/0041* (2013.01); *G01R 33/028* (2013.01)

(58) Field of Classification Search
USPC ........................................................ 324/304
See application file for complete search history.

(56) References Cited

U.S. PATENT DOCUMENTS 3,701,007 A 10/1972 Schad
3,736,502 A 5/1973 Schonstedt
(Continued)

FOREIGN PATENT DOCUMENTS

| EP | 2 474 877 A1 | 7/2012 |
| WO | WO 2010/051416 A1 | 5/2010 |
| WO | WO 2013/154440 A1 | 10/2013 |

OTHER PUBLICATIONS

Chiriac, et al.: "*Magnetic Field and Displacement Sensor Based on Linear Transformer with Amorphous Wire Core*"; Science Direct, www.sciencedirect.com, p. 172-173.
(Continued)

*Primary Examiner* — Rodney Fuller
(74) *Attorney, Agent, or Firm* — Tarolli, Sundheim, Covell & Tummino LLP (57) ABSTRACT

A system includes a helically polarized magnet having a plurality of north and south poles circumferentially and helically patterned along a linear axis. Magnetic flux varies at different positions along a linear path in a direction aligned with the linear axis. A multi-axis magnetometer and/or magnetometer array is configured with at least two sensing coils to detect the position of the helically polarized magnet by sensing the magnetic flux variations at the different positions along the linear path.

20 Claims, 8 Drawing Sheets

(51) Int. Cl.
  *G01D 5/14* (2006.01)
  *G01R 33/00* (2006.01)
  *G01R 33/028* (2006.01)

(56) References Cited

U.S. PATENT DOCUMENTS

| | | |
|---|---|---|
| 4,471,304 A | 9/1984 | Wolf |
| 4,764,743 A | 8/1988 | Leupold et al. |
| 4,929,899 A | 5/1990 | Weixelman et al. |
| 4,995,165 A | 2/1991 | Daniels |
| 5,493,216 A | 2/1996 | Asa |
| 7,363,827 B2 * | 4/2008 | Hedayat .......... G01L 3/102 148/100 |
| 7,859,253 B2 | 12/2010 | Manco et al. |
| 7,898,250 B2 | 3/2011 | In et al. |
| 8,076,940 B2 | 12/2011 | Martin et al. |
| 2001/0035749 A1 | 11/2001 | Nekado |
| 2004/0097803 A1 | 5/2004 | Panescu |
| 2004/0183526 A1 | 9/2004 | Galbreath et al. |
| 2004/0222788 A1 | 11/2004 | Low et al. |
| 2007/0113683 A1 | 5/2007 | Hedayat et al. |
| 2009/0001971 A1 | 1/2009 | Racz et al. |
| 2011/0133725 A1 | 6/2011 | Dengler |
| 2012/0155596 A1 | 6/2012 | Kowles et al. |
| 2012/0313632 A1 | 12/2012 | Martin et al. |
| 2015/0108974 A1 | 4/2015 | Kennedy et al. |

OTHER PUBLICATIONS

McFee, et al.: "*A Magnetometer System to Estimate Location and Size of Long, Horizontal Ferrous Rods*", IEEE Transactions on Instrumentation and Measurement, vol. 45, No. 1, Feb. 1996, p. 153-158.

* cited by examiner

LINEAR POSITIONING SYSTEM UTILIZING HELICALLY POLARIZED MAGNET

RELATED APPLICATIONS

This application is a continuation of U.S. patent application Ser. No. 14/195,530, filed 3 Mar. 2014, which is incorporated herein in its entirety.

TECHNICAL FIELD

This disclosure relates to linear positioning systems, and more particularly to a system that utilizes a helically polarized magnet to detect linear position.

BACKGROUND

Control systems often are required to work under extreme environmental conditions including high temperature and pressure. One aspect to the proper control involves the operation of position sensors under such conditions. The control system needs accurate position information from sensors in order to properly control machine movements in the system. An example environment where such conditions exist, involves the position measurement and control of control rods that are raised and lowered in a nuclear reactor. The nuclear reactor initiates and controls a sustained nuclear chain reaction via the raising and lowering of the control rods in the reactor core which ultimately requires controlled, precise, and reliable positioning to meet the ardent design constraints imposed on the reactor. Nuclear reactors are used at nuclear power plants for electricity generation and in propulsion of ships, for example. Heat from nuclear fission is passed to a working fluid (water or gas), which runs through turbines.

In some modern reactors, where the reactor internal components are housed in a single pressure vessel, measurement of the position is not possible using means previously utilized on commercial nuclear reactors. These reactor designs require sensors that must operate in an environment with temperatures over 300° C. and pressures over 2000 PSI as well as moderate vibration and radiation. Other design constraints require that the sensors provide a high resolution measurement of position (e.g., within 50 mils) over a stroke of about 100 inches and also have a design life of at least 60 years.

SUMMARY

This disclosure relates to linear positioning systems. In one aspect, a system includes a helically polarized magnet (HPM) having a plurality of north and south poles circumferentially and helically patterned along a linear axis. Thus the magnetic flux varies at different positions along a linear path in a direction aligned with the linear axis. A multi-axis magnetometer is configured with at least two sensing coils to detect the position of the helically polarized magnet by sensing the magnetic flux variations at the different positions along the linear path.

In another aspect, a system includes a helically polarized magnet having a plurality of north and south poles circumferentially and helically patterned along a linear axis. Magnetic flux direction varies at different positions along a linear path in a direction aligned with the linear axis. A sensor array is configured with a plurality of magnetometers. Each magnetometer in the sensor array is configured with at least two sensing coils to detect the position of the helically polarized magnet by sensing the magnetic flux variations at the different positions along the linear path.

In yet another aspect, a system includes a helically polarized magnet having a plurality of north and south poles circumferentially and helically patterned along a linear axis. The magnetic flux vector direction varies at different positions along a linear path in a direction aligned with the linear axis. A connecting rod is coupled to the HPM to move the HPM along the linear path. A control rod is coupled to the connecting rod to control a reaction in a nuclear reactor. One sensor or a sensor array is configured with a plurality of magnetometers. Each magnetometer in the sensor or sensor array is configured with at least two sensing coils to detect the position of the HPM by sensing the magnetic flux variations at the different positions along the linear path.

DETAILED DESCRIPTION

This disclosure relates to linear positioning systems that utilize a helically polarized magnet to detect linear position. In one example, a high resolution linear position system provides a linear displacement (position) of a control rod, while operating in environments that experience high temperatures, high pressures, and potentially emanate radioactivity. The system includes a rod position sensor array (high resolution linear position sensor) that includes a plurality of fluxgate magnetometer pairs arranged in a configuration that positions each pair on top of the next pair in a linear configuration. Each respective fluxgate magnetometer includes an excitation coil, through which a respective magnetometer can be excited at a respective (specific) frequency, and includes sensing coils, which in response to an excitation of the excitation coil generate a uniquely identifiable signal (excitation). In some applications, it may be desirable to minimize wiring to the sensors. In order to provide a respective (specific) excitation signal to a respective flux magnetometer, the system can employ a wiring configuration that utilizes a common electrical bus, and passive filters tuned to match the specific frequency of the respective magnetometer. The system further comprises a control rod, which includes a permanent magnet array helically polarized in a vertical axis (axis of rotation about a centerline of the control rod) along the portion of the rod that is to be sensed by the rod position sensor array.

During employment of the system, excitation signals at N specific frequencies (N being a positive integer) are externally generated (by control electronics) based on the quantity (N) of flux magnetometers within the rod position sensor array. Each of the magnetometers is thus excited in turn and in discrete time intervals via the common bus to the targeted flux magnetometer. If an excitation signal is within the bandwidth that a respective passive filter is configured to pass, the excitation signal is passed to the respective magnetometer in the rod position sensor array to excite a respective excitation coil. The excitation of the excitation coil causes sensing coils in the respective magnetometer to respond, and generate an identifiable signal. As the control rod traverses along a vertical axis in either direction, the magnetic field generated by the permanent magnet array of the control rod interacts with the sensing coils of the magnetometer in the rod position sensor array. The interaction of the magnetic field causes the generated identifiable signal of a magnetometer to experience an induced magnetic change (an alteration in a magnetic field strength). This change can be detected (via control electronics), and utilized to provide a precise current location of the control rod.

Figure 1:
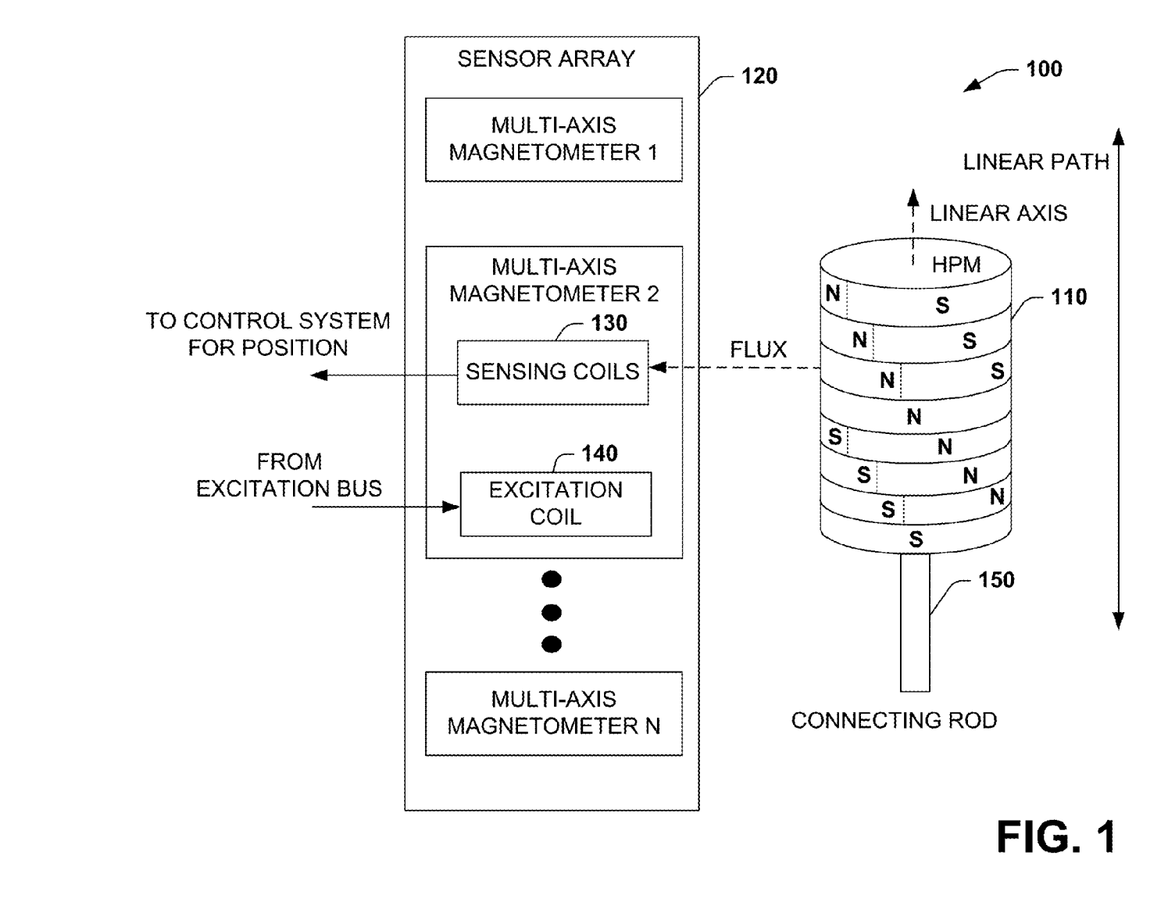
FIG. 1 illustrates an example of a system that employs a helically polarized magnet to detect linear position in a harsh environment.

FIG. 1 illustrates an example of a system 100 that employs a helically polarized magnet 110 to detect linear position in a harsh environment. The system 100 includes the helically polarized magnet 110 (HPM) having a plurality of north and south poles (shown symbolically as N's and S's) circumferentially and helically configured along a linear axis. For example, a plurality of disk magnets can be configured along the linear axis with each disk magnet having a respective north and south pole. Each of the disk magnets can then be rotationally positioned with respect to a neighboring magnet to form the helically arranged pattern of north and south poles along the linear axis (e.g., rotate each disk with respect to its preceding disk on the linear axis 15 degrees). Magnetic flux emanates from the helically patterned north and south poles to signal a position of the HPM 110 as the HPM moves along a linear path in a direction aligned with the linear axis. A sensor array 120 can include one or more multi-axis magnetometers shown as magnetometers 1-N, with N being a positive integer. As used herein, the term multi-axis refers to a number of sensing coils that are configured within a given magnetometer. Using orthogonal sensing coils allows for the tolerance of variations in field strength over time and over the length of the array.

Typically, an X coil and a Y coil are configured at 90 degree angles with respect to each other within a given multi-axis magnetometer although more than two sensing coils can be employed. Each of the sensing coils will have its response proportional to the angle of the flux vector from the segment of the HPM 110 it is "viewing." There is an advantage in using at least two sensing coils, orthogonally oriented, so that the ratio of the response can be used to calculate flux angle, allowing for variations in field strength. In another example, a single axis (single coil) magnetometer can be configured for less precise positioning applications.

For purposes of brevity, only a single magnetometer will be described but each magnetometer in the sensor array 120 can be similarly configured. As shown at the example of multi-axis magnetometer 2 (also referred to as MA2) of the sensor array 120, each magnetometer can be configured with at least two sensing coils 130 to detect the position of the HPM 110 by sensing the magnetic flux emanating from the north and south poles as the HPM moves along the linear path. Although the sensor array 120 is typically stationary and receives the flux from a moving HPM 110, it is possible that the HPM 110 is held stationary and the multi-axis magnetometers and/or sensor array 120 are moved to sense the magnetic flux emanating from the north and south poles. It is also possible that both the HPM 110 and the sensor array 120 concurrently move their respective positions.

An excitation coil 140 in the multi-axis magnetometer MA2 receives an excitation frequency to generate a magnetic field that interacts with the HPM 110. The sensor array 120 can include a plurality of multi-axis magnetometers to detect position as the HPM 110 moves in proximity with respect to each of the magnetometers. Each of the excitation coils for each of the multi-axis magnetometers in the sensor array 120 can be driven by separate excitation signals. Each of the sensing coils can provide a separate position output signal for each of the plurality of multi-axis magnetometers. In some examples, more than two coils 130 can be employed in each multi-axis magnetometer in the sensor array 120 to potentially increase the resolution of the respective magnetometer.

In another example, each of the excitation coils for each of the multi-axis magnetometers sensor array 120 can be driven by a common excitation signal, whereas each of the sensing coils can provide a position output signal for each of the multi-axis magnetometers on to a common signal bus. Rather than providing separate wires to each magnetometer, the common excitation signal minimizes the number of wires running to each of the sensors, and to the control electronics located outside the harsh environment. It is beneficial to minimize the number of wires due to the challenges of passing signal wires through the reactor vessel wall, for example. In order to utilize a common signal bus, each of the excitation coils for each of the multi-axis magnetometers in the sensor array 120 can include a bandpass filter (not shown) to selectively enable the position output signal for each of the multi-axis magnetometers on to the common signal bus. For instance, excitation signals at specific frequencies can be externally generated (by control electronics not shown) based on the quantity of magnetometers within the sensor array 120, and are transmitted continuously at different fixed (discrete) time intervals via the common bus to the magnetometers. If an excitation signal is within the bandwidth that a respective bandpass filter is configured to pass, the excitation signal is passed to the respective magnetometer in the sensor array 120 to excite a respective excitation coil. The excitation of the excitation coil 140 causes sensing coils 130 in the respective magnetometer to respond, and generate an identifiable signal. As the HPM 110 propagates along the linear axis in either direction, the magnetic field direction generated by the HPM interacts with the sensing coils of the magnetometer in the sensor array 120. The interaction of the magnetic field causes the generated identifiable signal of a magnetometer to experience an induced magnetic change (an alteration in a magnetic field strength). This change can be detected (via control electronics), and utilized to provide a precise current location of the HPM 110.

In one example, a modulated drive signal having separate modulating frequencies can be employed to excite each of the excitation coils for each of the multi-axis magnetometers in the sensor array 120. Each bandpass filter can respond to one of the separate modulating frequencies to selectively enable the position output signal for each of the multi-axis magnetometers on to the common signal bus. Each of the sensing coils 130 can be positioned orthogonally with respect to each other within the multi-axis magnetometer. In one example, the multi-axis magnetometer can include a torroidal core that is wrapped with an excitation coil and the sensing coils positioned orthogonally with respect to each other thereon. The HPM 110 and multi-axis magnetometers will be illustrated and described in more detail below. In one specific example, the HPM 110 can be connected to a control rod in a nuclear reactor via a connecting rod 150. Although nuclear control application examples are described herein, other control applications that employ linear positioning are also possible. Output from the sensing coils 130 can be provided to a control system (not shown) to monitor linear position via the multi-axis magnetometer and to control movement of the control rod 150.

The system 100 provides a high-resolution, high-reliability, magnetic, linear position sensor that can operate in a high-temperature (350° C.) and high pressure (2300 psi) fluid (air, water, oil, and so forth) with exposure to moderate-to-high levels of radioactivity, for example, to sense the linear position of the control rod 150 within a nuclear reactor. In one example, the sensor array 120 utilizes pairs of fluxgate magnetometers in the sensor array 120 and the helically polarized permanent magnet 110. Each pair of magnetometers is located adjacent to the permanent magnet 110 and each of the magnetometers is generally oriented orthogonally to each other. The permanent magnet rod (or array of magnets composing a rod) is helically polarized (axis of rotation about the linear axis and centerline of the rod) and attached to or embedded within the connecting rod 150 of the control rods. As the connecting rod and permanent magnet translates along the linear path, the direction of the magnetic field passing through the magnetometers changes in a sinusoidal manner.

The direction of the magnetic field sensed by each of the magnetometers can vary sinusoidally with about a 90 degree offset between the two sensors. The arctangent of the ratio of the magnetic flux detected by one magnetometer sensing coil over the flux measured by the other sensing coil provides a linear representation of the intercepted angle of the magnetic field. This angle can be correlated to the pitch of the rod's helical polarization to provide a measurement of the linear displacement of the magnetic rod 110 and connecting rod 150. By utilizing a ratio-metric measurement, changes in magnitude of the magnetic field due to environment effects such as temperature variations during operation or manufacturing and assembly variations are factored out of the measurement as it is computed as the ratio of the flux that is determining the measured angle.

The system 100 can provide an accurate measurement of the position of the control rods even in the presence of environmental conditions (e.g., temperature and pressure) that can cause the strength of the permanent magnets to vary. The system 100 provides single-fault tolerance as it has the capability to continue to provide the position of the control rods with a failure of a single magnetic field sensor. This permits greater flexibility in the choice of any intervening metallic material as it can tolerate some magnetic field strength weakening due to presence of permeable material between the sensor and permanent magnet. Additionally, there are no moving parts associated with the sensor and sensor electronics so mechanical wear should not impact the longevity or accuracy of the system. Although vertical movement is depicted along the linear path in the system 100, other linear measurements are also possible. This can include detecting position along a horizontal axis, for example, or some other linear path that is between horizontal and vertical depending on the physical orientation of the sensor array 120 and the HPM 110. For high reliability operation, redundant magnetometers can be configured at each location in the sensor array 120. Each of the redundant magnetometers is thus active concurrently at each location in the sensor array 120 to provide sensing if one of the magnetometers of the redundant magnetometers fails.

Figure 2:
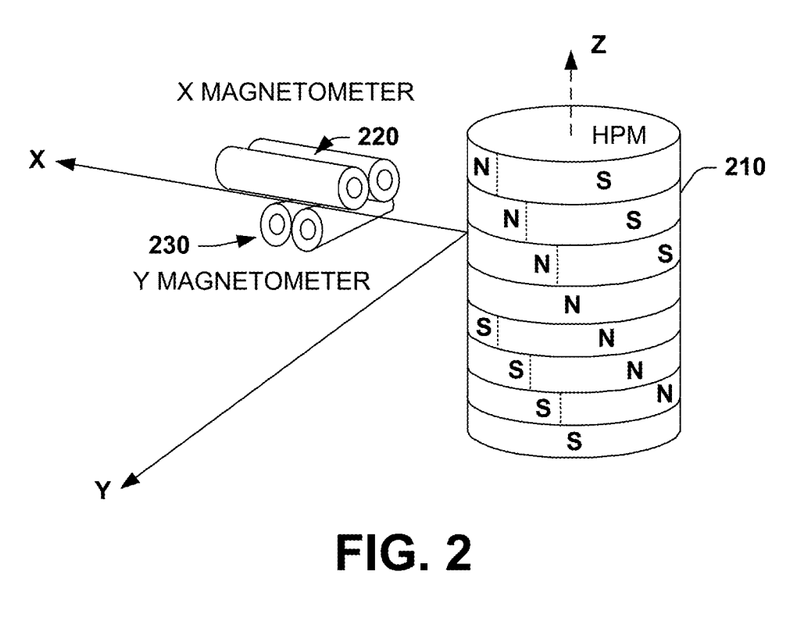
FIG. 2 illustrates an example of a helically polarized magnet and magnetometer configuration to detect linear position.

FIG. 2 illustrates an example of a helically polarized magnet 210 (HPM) and magnetometer configuration to detect linear position. In this example, two magnetometers 220 and 230 are arranged in close proximity to the HPM 210 that can be attached to a connecting rod (not shown) for translation of the HPM along a linear path. Each magnetometer 220 and 230 is capable of sensing the magnitude of the magnetic field through its axis of orientation. For example, the X-axis magnetometer 220 is able to sense the x-axis component of the magnetic field emanating from the HPM 210 and similarly the Y-axis magnetometer 230 is able to sense the y-axis component of the magnetic field.

The HPM 210 can be configured as a helically polarized permanent magnet array comprising a series of disc magnets each polarized across its radius. Each disc can be positionally rotated about its axis from neighboring disks. The net result is a magnetic field surrounding the array that has a varying magnetic polarization along the axial length of the array shown about axis Z. In one specific example, the HPM array can be configured as a plurality of disk magnets (e.g., 7) with centers spaced about an inch or less apart from each other in a vertical stack-up. Each disc can be positionally rotated about its axis about 15 mechanical degrees from its neighboring disk such that the entire amount of rotation of the magnetic field vector for the stack is about 90 mechanical degrees.

Figure 3:
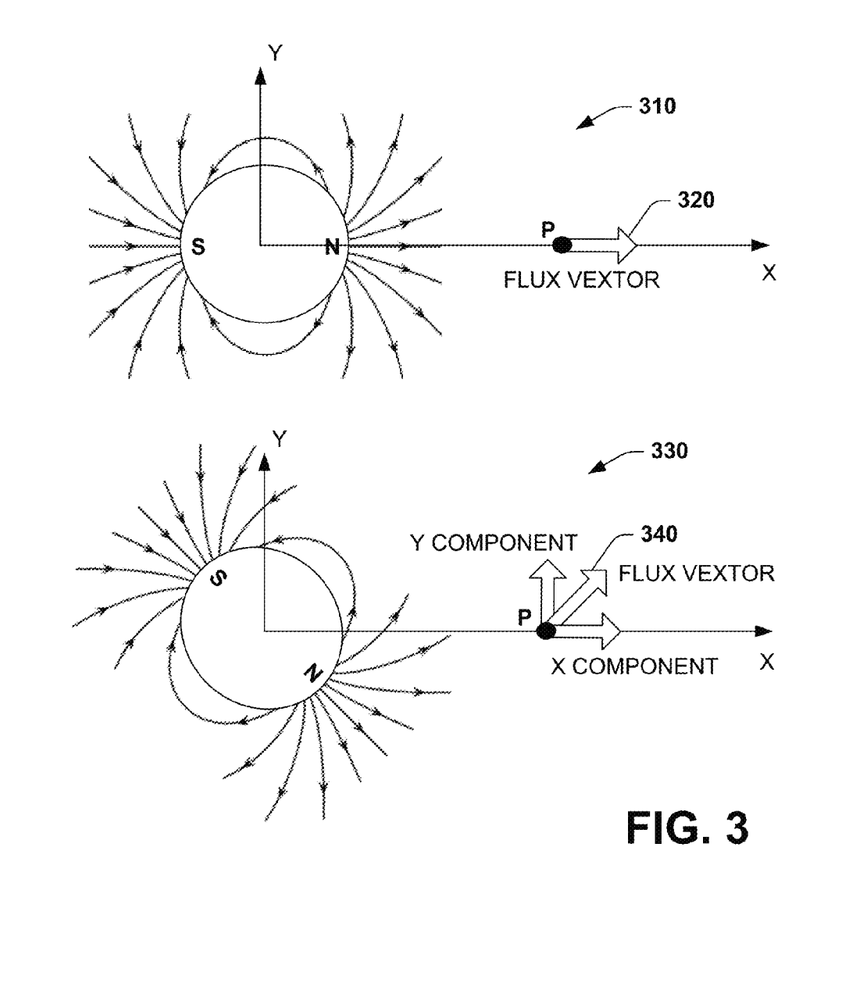
FIG. 3 illustrates flux diagrams for the helically polarized magnet and magnetometer configuration depicted in FIG. 2.

FIG. 3 illustrates flux diagrams for the helically polarized magnet and magnetometer configuration, for a specific disk, as depicted in FIG. 2. The magnetometer pair of FIG. 2 is used to detect the change in magnetic polarization direction as the connecting rod attached to the HPM translates up and down (or other linear direction). As the permanent magnet array translates up or down, the two-axis magnetometer measures a changing magnetic field direction from the array. This can be observed in FIG. 3 which depicts the magnetic field from the HPM in the plane of the magnetometer pair (x-y plane) looking from the top of the magnet array down. The point "P" represents the location of the magnetometer pair.

A diagram 310 depicts the magnetic field from the permanent magnet array and is oriented such that the north facing pole is pointing directly at the magnetometer array in the x-direction which generates flux vector 320. For diagram 330, the connecting rod has moved linearly some distance and now the magnetic field from the HPM array is offset 45 degrees from its previous position and generating flux vector 340. The arrangement of the two magnetometers enables the x- and y-component of the magnetic field from the magnet array to be determined. Since the HPM array is polarized in a helical manner, the magnetic field detected by the magnetometers varies sinusoidally as the connecting rod translates the HPM up and down (or other linear direction depending on orientation of HPM and magnetometers).

Figure 4:
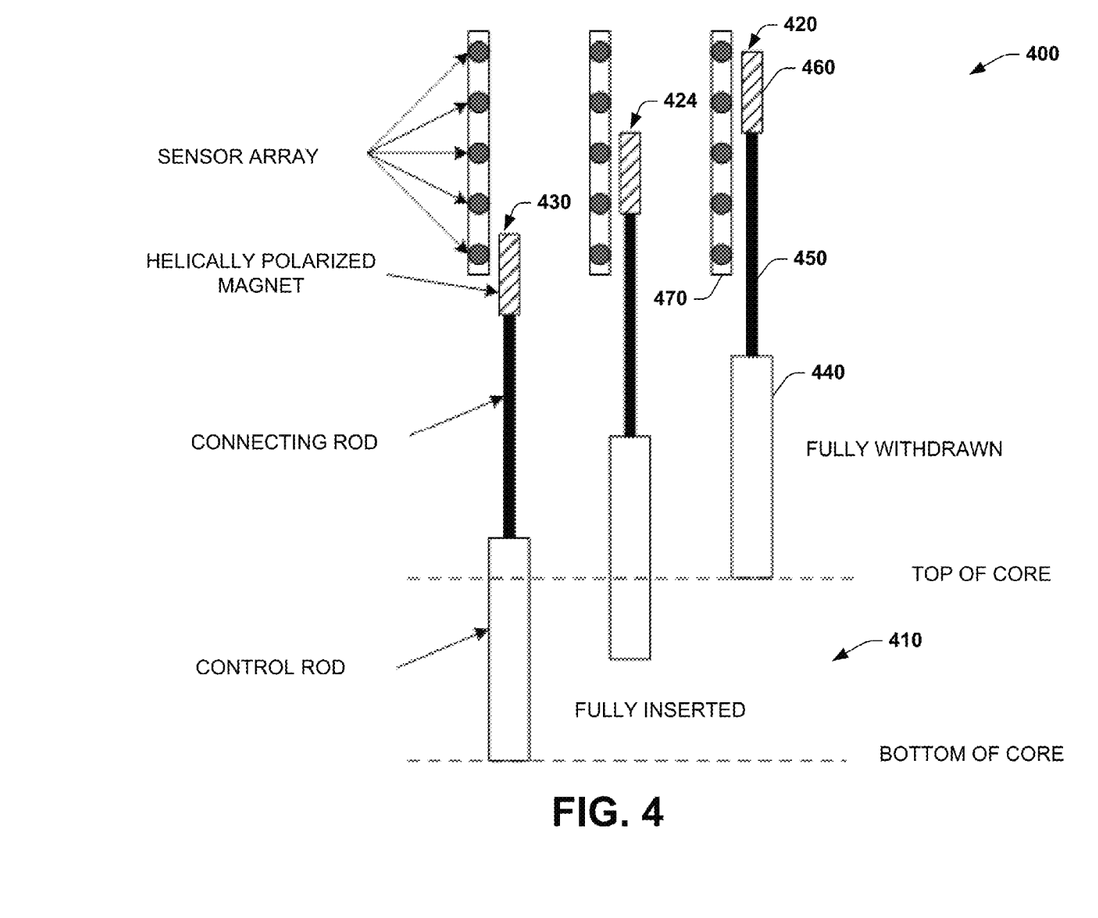
FIG. 4 illustrates a linear positing system utilizing a helically polarized magnet and sensor array to determine linear position for control rods that are raised and lowered in a nuclear reactor core.

FIG. 4 illustrates a linear positing system 400 utilizing a helically polarized magnet and sensor array to determine linear position for control rods that are raised and lowered in a nuclear reactor core 410. Three potential positions 420, 424, and 430 are shown for a control rod 440 that is raised and lowered into the core 410. The position 420 shows the control rod fully withdrawn from the core 410, the position 424 shows the control rod at about half way into the core, and position 430 shows the control rod fully inserted into the core. The control rod 440 is connected via connecting rod 450 to a helically polarized magnet 460 (HPM). A sensor array 470 having a plurality of two-axis magnetometers (e.g., X and Y axis sensing coils with a single excitation coil for each magnetometer) detects flux from the HPM 460 to determine linear position of the control rod 440 as it moves along a vertical path in this example into and out of the core 410.

The configuration of the connecting rod 450 and sensor array 470 is such that the sensor array is parallel to and offset from the control rod with no contact between the two. Typically, all of the structures near them are made from materials with low magnetic permeability (e.g., very close to one). The exceptions to this low permeability requirement include the possible use of a magnetic shield to reduce interactions with other nearby sensors and motor located at one end of the rod position system. A HPM array 460 can be affixed to or embedded within the top of the connecting rod 450 such that it moves linearly past the sensor array 420 as the control rod 440 moves in and out of the reactor core 410. As the connecting rod 450 is raised or lowered, the HPM 460 passes by one or more of the two-axis magnetometers in the sensor array 470. In one example, the vertical spacing of the two-axis magnetometers in the sensor array 470 can be set such that the HPM 460 spans at least two of the two-axis magnetometers in the sensor array. This provides the capability of measuring the position of the connecting rod 450 even with the loss of a single two-axis magnetometer (e.g., to support fault-tolerant operation).

Figure 5:
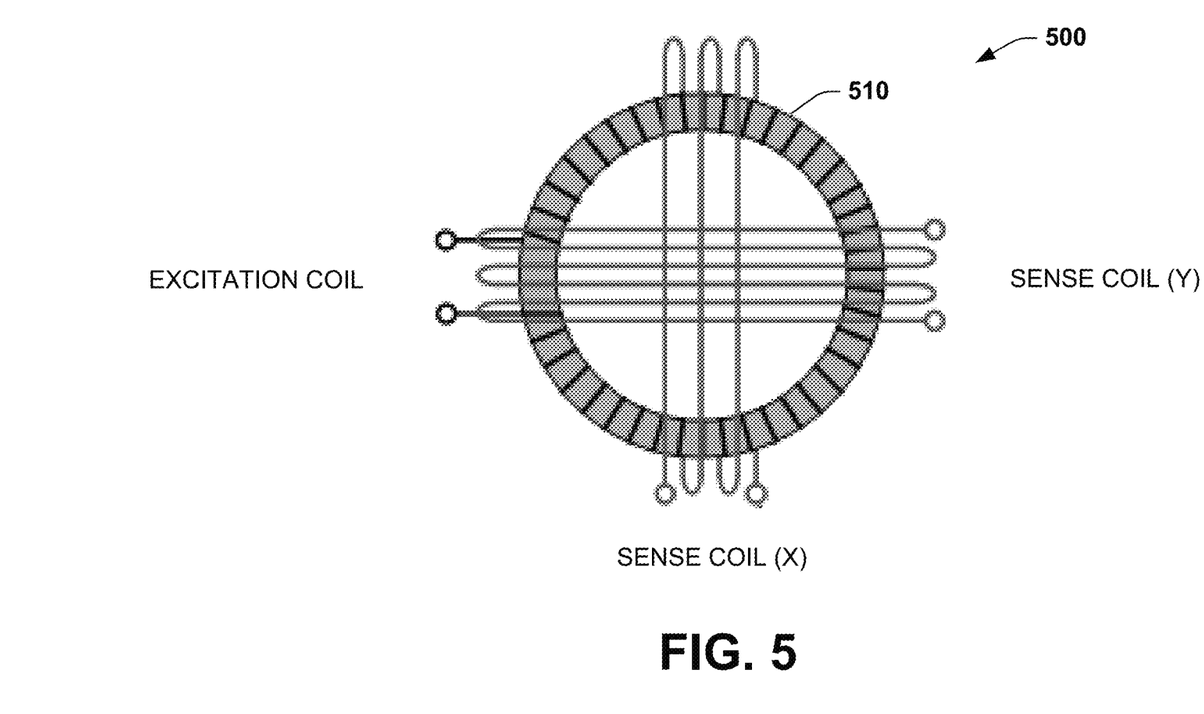
FIG. 5 illustrates an example of a two-axis magnetometer to sense magnetic flux from a helically polarized magnet.

FIG. 5 illustrates an example of a two-axis magnetometer 500 to sense magnetic flux from a helically polarized magnet. The magnetometer 500 can be employed in place of the two discrete magnetometers (one each for the x and y directions) discussed above with respect to FIG. 2. This configuration provides a more volume efficient design than two discrete sensors (one x-magnetometer and one y-magnetometer). As shown, an excitation coil wraps a torroidal core 510 where an x-sense coil and a y-sense coil are positioned orthogonally about the core with respect to each other at about 90 degree spacing.

Figure 6:
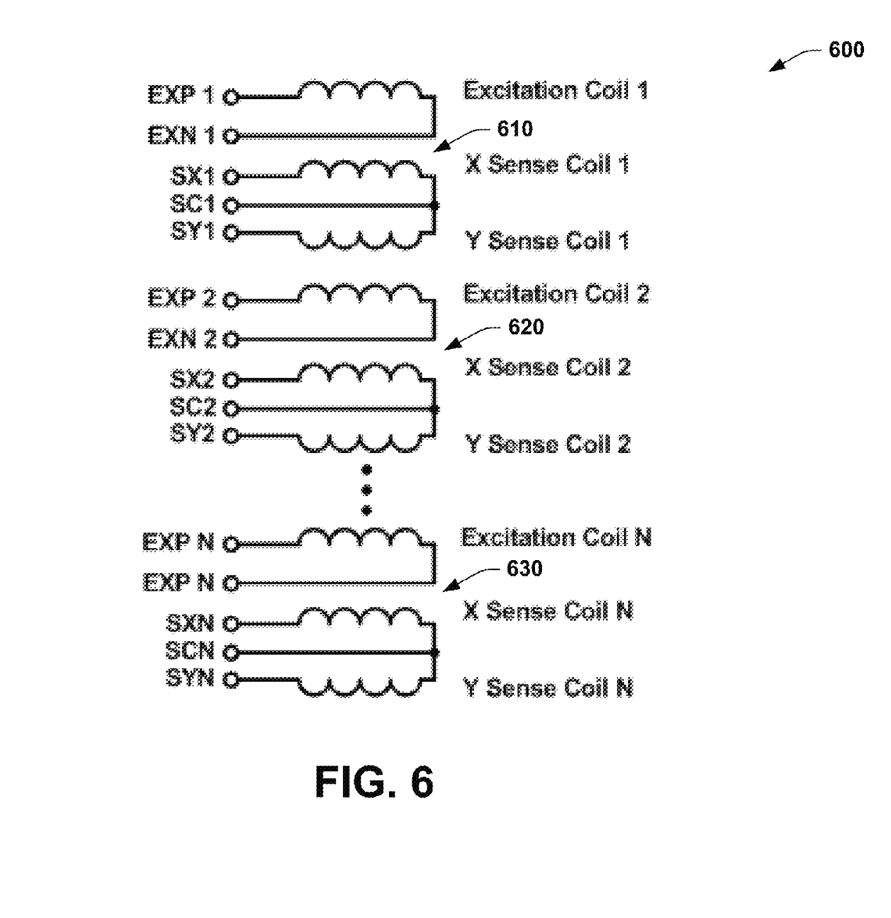
FIG. 6 illustrates an example excitation configuration for a sensor array to sense magnetic flux from a helically polarized magnet.

FIG. 6 illustrates an example excitation configuration 600 for a sensor array to sense magnetic flux from a helically polarized magnet. In this example, a plurality of two axis magnetometers can be excited individually via excitation signals shown as EXP 1 and EXN 1 for magnetometer 1 at 610, EXP 2 and EXN 2 for magnetometer 2 at 620, and EXP N and EXN N for magnetometer N at 630, with N being a positive integer. In one example, separate excitation signals can be provided to each magnetometer 610 through 630. In another example, a common excitation signal can be provided to each magnetometer 610 though 630. As shown, each magnetometer 610 through 630 can include an x and a y-sensing coil sharing a common connection. The respective signals can be individually processed by a control system (not shown) to detect position of an HPM as described above.

Figure 7:
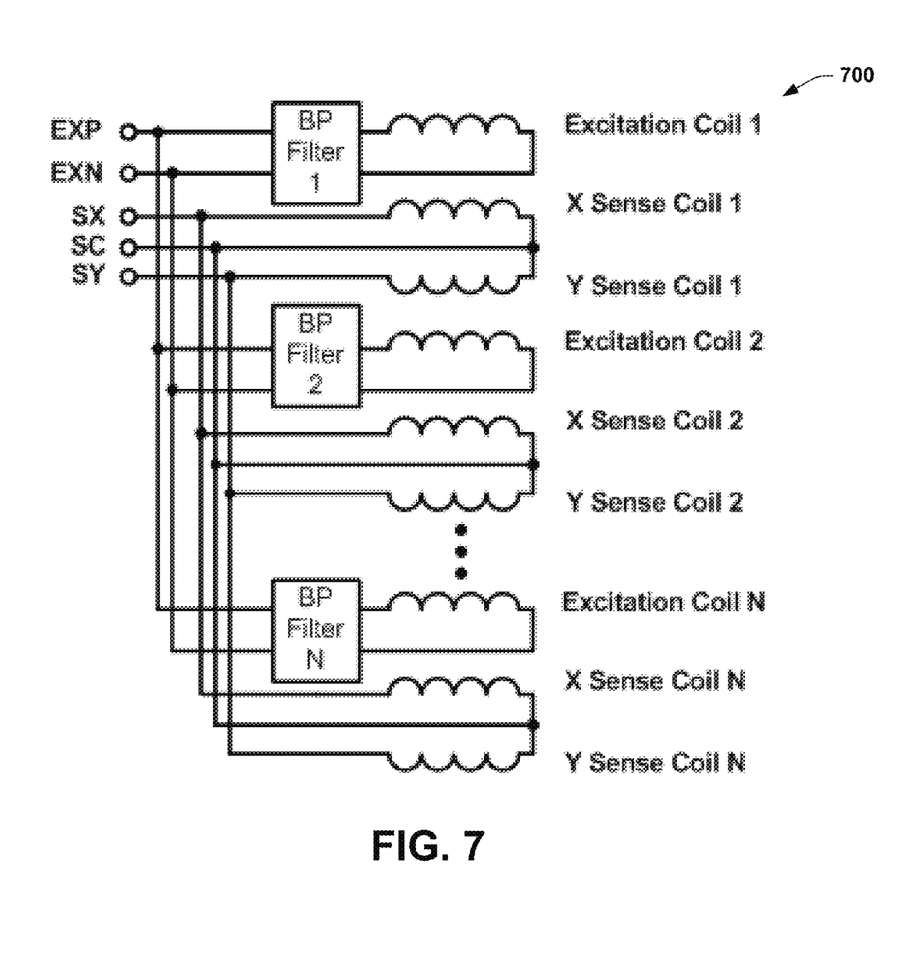
FIG. 7 illustrates an alternative example excitation configuration for a sensor array to sense magnetic flux from a helically polarized magnet.

FIG. 7 illustrates an alternative example excitation configuration 700 for a sensor array to sense magnetic flux from a helically polarized magnet. In this example, a common excitation and sensing configuration is employed to mitigate wiring connections as depicted in FIG. 6. The configuration 700 shows that each two-axis magnetometer has an excitation coil fed by two conductors (EXP N and EXN N) where N is a number between 1 and the total number of two-axis magnetometers utilized in the system. Similarly, each sense coil pair can be associated with three conductors (SX N, SC N, SY N) corresponding to the X direction sense coil voltage output, electrical common and y-direction sense coil voltage output respectively. The various excitation coils and sense coils are connected in a bus arrangement via separately tuned bandpass filters shown as BP 1, BP 2, and BP N.

Figure 8:
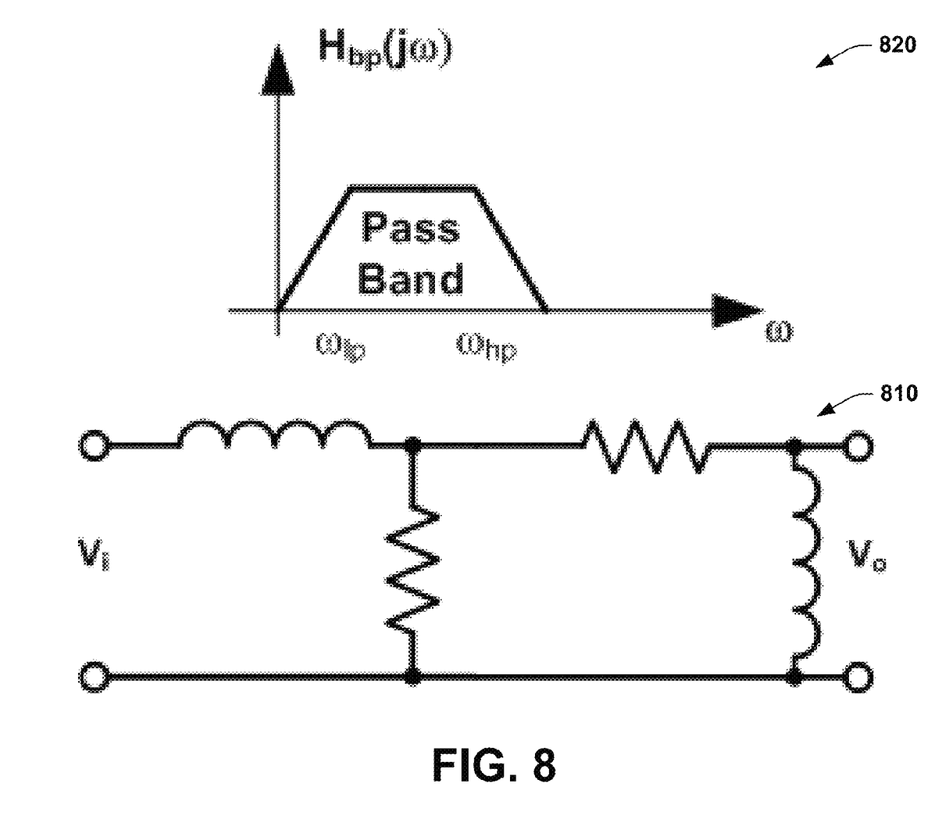
FIG. 8 illustrates an example of a bandpass filter and response that can be employed with a common excitation and sensing configuration for a two axis magnetometer.

At predetermined intervals in time, an excitation signal of a specific frequency is applied at the EXP and EXN terminals. The bandpass filters can be configured such that only a single bandpass filter will pass the excitation signal to its associated excitation coil. Thus, only the two-axis sense coils associated with that magnetometer's excitation coil will generate a signal in response. Interface electronics connected to the sense coil output bus (SX, SC, SY) can identify which two-axis sensor has generated the waveform by determining the frequency assignment of each of the excitation coils. FIG. 8 illustrates one possible example of a bandpass filter 810 and response at 820.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system, comprising:
   helically polarized magnets rotationally positioned with respect to neighboring magnets to form a circumferentially and helically arranged pattern of north and south poles along a linear axis, wherein magnetic flux varies at different positions along a linear path in a direction aligned with the linear axis; and
   a magnetometer configured with at least one magnetic flux sensor to detect the position of the helically polarized magnets by sensing the magnetic flux variations at the different positions along the linear path.

2. The system of claim 1, wherein at least one of the helically polarized magnets and the magnetometer is held stationary and at least one of the helically polarized magnets and the magnetometer is moved along the linear path.

3. The system of claim 1, further comprising an excitation coil in the magnetometer that receives an excitation frequency to generate a magnetic field that interacts with the helically polarized magnets.

4. The system of claim 3, further comprising a sensor array that includes a plurality of multi-axis magnetometers to detect position as the helically polarized magnets move in proximity with each of the magnetometers, wherein each of the plurality of multi-axis magnetometers include at least two sensing coils and the excitation coil respectively.

5. The system of claim 4, wherein each of the excitation coils for each of the plurality of multi-axis magnetometers is driven by separate excitation signals and each of the at least two sensing coils provides a separate position output signal for each of the plurality of multi-axis magnetometers.

6. The system of claim 4, wherein each of the excitation coils for each of the plurality of multi-axis magnetometers is driven by a common excitation signal and each of the at least two sensing coils provides a position output signal for each of the plurality of multi-axis magnetometers on to a common signal bus.

7. The system of claim 6, wherein each of the excitation coils for each of the plurality of multi-axis magnetometers includes a bandpass filter to selectively enable the position output signal for each of the plurality of multi-axis magnetometers on to the common signal bus.

8. The system of claim 7, further comprising a modulated drive signal having separate modulating frequencies to excite each of the excitation coils for each of the plurality of multi-axis magnetometers, wherein each bandpass filter responds to one of the separate modulating frequencies to selectively enable the position output signal for each of the plurality of multi-axis magnetometers on to the common signal bus.

9. The system of claim 1, wherein the at least one magnetic flux sensor is positioned orthogonally with respect to another magnetic flux sensor within the magnetometer.

10. The system of claim 9, wherein the magnetometer further comprises a torroidal core that is wrapped with an excitation coil and the at least one magnetic flux sensor positioned orthogonally with respect to another magnetic flux sensor thereon.

11. The system of claim 10, wherein a direction of a magnetic field sensed by the magnetometer varies sinusoidally with a 90 degree offset between the at least one magnetic flux sensor and an arctangent of a ratio of magnetic flux detected by one sensing coil of the at least one magnetic flux sensor over the flux measured by another coil of the at least one magnetic flux sensor provides a linear representation of an intercepted angle of the magnetic field.

12. The system of claim 11, wherein an angle from the arc tangent of the ratio of magnetic flux is correlated to a pitch of sensed helical polarization to provide a measurement of linear displacement of the helically polarized magnets.

13. The system of claim 1, wherein the helically polarized magnets are connected to a control rod in a nuclear reactor.

14. The system of claim 13, further comprising a control system to monitor linear position via the magnetometer and to control movement of the control rod.

15. A system, comprising:
helically polarized magnets rotationally positioned with respect to neighboring magnets to form a circumferentially and helically arranged pattern of north and south poles along a linear axis, wherein magnetic flux varies at different positions along a linear path in a direction aligned with the linear axis; and
a sensor array configured with a plurality of magnetometers, each magnetometer in the sensor array configured with at least one magnetic flux sensor to detect the position of the helically polarized magnets by sensing the magnetic flux variations at the different positions along the linear path.

16. The system of claim 15, wherein each magnetometer in the sensor array includes an excitation coil that is driven by a common excitation signal and the at least one magnetic flux sensor for each magnetometer of the sensor array provides a position output signal for each of the magnetometers on to a common signal bus.

17. The system of claim 16, wherein each of the excitation coils for each of the magnetometers includes a bandpass filter to selectively enable the position output signal for each magnetometer of the sensor array on to the common signal bus.

18. The system of claim 17, further comprising a modulated drive signal having separate modulating frequencies to excite each excitation coil for each magnetometer of the sensor array, wherein each bandpass filter responds to one of the separate modulating frequencies to selectively enable the position output signal for each magnetometer on to the common signal bus.

19. A system, comprising:
helically polarized magnets (HPMs) rotationally positioned with respect to neighboring magnets to form a circumferentially and helically arranged pattern of north and south poles along a linear axis, wherein magnetic flux varies at different positions along a linear path in a direction aligned with the linear axis;
a connecting rod coupled to the HPMs to move the HPMs along the linear path;
a control rod coupled to the connecting rod to control a reaction in a nuclear reactor; and
a sensor array configured with a plurality of magnetometers, each magnetometer in the sensor array configured with at least one magnetic flux sensor to detect the position of the HPMs by sensing the magnetic flux variations at the different positions along the linear path.

20. The system of claim 19, wherein each magnetometer in the sensor array includes an excitation coil that is driven by a common excitation signal and the at least one magnetic flux sensor for each magnetometer of the sensor array provides a position output signal for each of the magnetometers on to a common signal bus.

* * * * *